(12) United States Patent
Fudo et al.

(10) Patent No.: US 10,770,644 B2
(45) Date of Patent: Sep. 8, 2020

(54) PIEZOELECTRIC DEVICE

(71) Applicant: ALPS ALPINE CO., LTD., Ota-ku, Tokyo (JP)

(72) Inventors: Heishiro Fudo, Tokyo (JP); Yasuji Hagiwara, Tokyo (JP); Daisuke Takai, Tokyo (JP); Shoji Sakurai, Tokyo (JP); Masahiro Ishida, Tokyo (JP); Yo Tahara, Tokyo (JP)

(73) Assignee: ALPS ALPINE CO., LTD., Tokyo (JP)

( * ) Notice: Subject to any disclaimer, the term of this patent is extended or adjusted under 35 U.S.C. 154(b) by 501 days.

(21) Appl. No.: 15/646,160

(22) Filed: Jul. 11, 2017

(65) Prior Publication Data
US 2017/0317265 A1 Nov. 2, 2017

Related U.S. Application Data

(63) Continuation of application No. PCT/JP2016/051004, filed on Jan. 14, 2016.

(30) Foreign Application Priority Data

Jan. 21, 2015 (JP) .................................. 2015-009285

(51) Int. Cl.
*H01L 41/113* (2006.01)
*H01L 41/053* (2006.01)
(Continued)

(52) U.S. Cl.
CPC ........ *H01L 41/1132* (2013.01); *H01L 41/047* (2013.01); *H01L 41/0477* (2013.01);
(Continued)

(58) Field of Classification Search
CPC ............. H01L 41/1132; H01L 41/1138; H01L 41/047; H01L 41/0477; H01L 41/0478;
(Continued)

(56) References Cited

U.S. PATENT DOCUMENTS 5,142,511 A * 8/1992 Kanai .................. B06B 1/0625
310/358
6,523,423 B1  2/2003 Namerikawa et al.
(Continued)

FOREIGN PATENT DOCUMENTS

| CN | 102290527 | 12/2011 |
| CN | 103579493 | 2/2014 |
| JP | 2004-033048 | 2/2004 |

OTHER PUBLICATIONS

International Search Report for PCT/JP2016/051004 dated Apr. 5, 2016.

*Primary Examiner* — Derek J Rosenau
(74) *Attorney, Agent, or Firm* — Hunton Andrews Kurth LLP

(57) ABSTRACT

A piezoelectric device includes a substrate that is flexible and thermally deformable, and a composite piezoelectric body disposed on the substrate. Output in accordance with deformation of the composite piezoelectric body is obtained. The composite piezoelectric body includes a piezoelectric layer containing an organic binder containing piezoelectric particles, a first electrode layer stacked on a first surface side of the piezoelectric layer, and a second electrode stacked on a second surface side of the piezoelectric layer. The substrate is insert molded and integrated with a molded resin body having a curved shape.

7 Claims, 9 Drawing Sheets

(51) Int. Cl.

| | |
|---|---|
| *H01L 41/047* | (2006.01) |
| *H01L 41/37* | (2013.01) |
| *H01L 41/08* | (2006.01) |
| *H01L 41/333* | (2013.01) |
| *H01L 41/314* | (2013.01) |
| *H01L 41/18* | (2006.01) |
| *H01L 41/33* | (2013.01) |

(52) U.S. Cl.
CPC ...... *H01L 41/0478* (2013.01); *H01L 41/0533* (2013.01); *H01L 41/081* (2013.01); *H01L 41/0805* (2013.01); *H01L 41/1138* (2013.01); *H01L 41/183* (2013.01); *H01L 41/314* (2013.01); *H01L 41/33* (2013.01); *H01L 41/333* (2013.01); *H01L 41/37* (2013.01)

(58) Field of Classification Search
CPC .. H01L 41/053; H01L 41/0805; H01L 41/081
USPC ................................. 310/330, 358
See application file for complete search history.

(56) References Cited

U.S. PATENT DOCUMENTS

| | | |
|---|---|---|
| 2012/0057730 A1 | 3/2012 | Fujise et al. |
| 2012/0064344 A1* | 3/2012 | Muramatsu ............ B82Y 30/00 428/402 |
| 2013/0043766 A1 | 2/2013 | Takahashi et al. |

\* cited by examiner

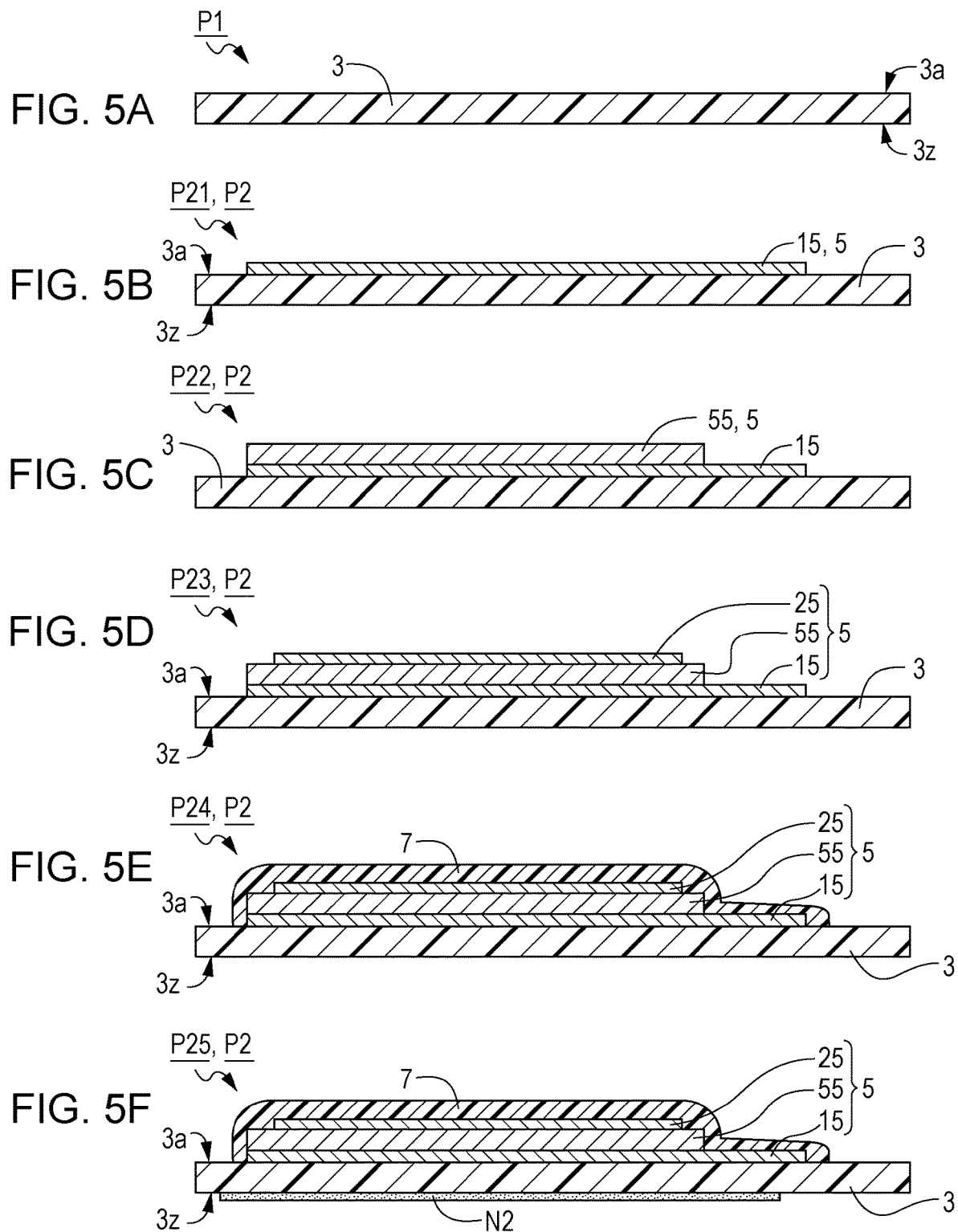

PIEZOELECTRIC DEVICE

CLAIM OF PRIORITY

This application is a Continuation of International Application No. PCT/JP2016/051004 filed on Jan. 14, 2016, which claims benefit of Japanese Patent Application No. 2015-009285 filed on Jan. 21, 2015. The entire contents of the aforementioned applications are incorporated herein by reference.

BACKGROUND OF THE INVENTION

1. Field of the Invention

The present invention relates to a piezoelectric device for use in various sensors and the like.

2. Description of the Related Art

Piezoelectric elements can perform energy conversion between electric energy and mechanical energy, and such piezoelectric elements are widely used in various sensors. Most of piezoelectric elements commonly known use ceramic dielectric bodies, and those types of elements prepared by sintering at high temperature are used.

One example of such piezoelectric devices is disclosed in Japanese Unexamined Patent Application Publication No. 2011-151285 (related art example 1), which is a piezoelectric element 800 of a type prepared by sintering a compact of a mixture of a powder dielectric at high temperature, as illustrated in FIG. 8. FIG. 8 is a schematic cross-sectional view of the piezoelectric element 800 according to related art example 1. As illustrated in FIG. 8, the piezoelectric element 800 according to related art example 1 uses, for example, zirconia in a substrate 801, for example, an indium-tin oxide in upper and lower conductive layers (first conductive layer 810 and second conductive layer 830), and, for example, lead titanate or lead zirconate titanate in a piezoelectric layer (dielectric layer) 820, and is prepared by performing a heat treatment at a high temperature of 450° C. to 800° C.

Since the piezoelectric element 800 of related art example 1 uses a dielectric body consolidated by firing, it is rarely usable in applications, such as various sensors and power generation, that require flexibility. Thus, composite piezoelectric bodies (polymer composite piezoelectric body 910) such as one proposed in Japanese Unexamined Patent Application Publication No. 2012-142546 (related art example 2) have drawn attention. FIG. 9 is a schematic cross-sectional view of the polymer composite piezoelectric body 910 of related art example 2.

The polymer composite piezoelectric body (piezoelectric composite) 910 of related art example 2 is formed of, as illustrated in FIG. 9, a composite 916 that includes a polymer matrix 912 composed of cyanoethylated polyvinyl alcohol (cyanoethylated PVA) and piezoelectric particles 914 composed of a ferroelectric material uniformly dispersed in the polymer matrix 912. A lower electrode 920 is disposed on a lower surface 916b of the composite 916, and an upper electrode 922 is disposed on an upper surface 916a. The composite 916 is polarized (poling) in a vertical direction. Since the polymer composite piezoelectric body 910 is a composite body in which the piezoelectric particles 914 are uniformly dispersed in the polymer matrix 912 and has flexibility, it can be used in applications that require flexibility.

In recent years, there have been demands to increase the output obtained from such composite piezoelectric bodies (polymer composite piezoelectric body 910). However, since the composite piezoelectric bodies are composite materials, there has been an issue that the thickness, which significantly affects the output, cannot be increased as easily as the piezoelectric element 800 of related art example 1.

There have also been demands to use such composite piezoelectric bodies in curved shapes. To meet the demands, the inventors have made an attempt of forming a composite piezoelectric body into a substrate and bonding this substrate to a substrate having a curved shape. However, the thickness of the adhesive layer applied for bonding has varied, and this has sometimes adversely affected the properties output. Moreover, for curved shapes having two or higher dimensions, it is difficult to bond the substrate to copy the curved shape, and there has been an issue that the properties output are further adversely affected.

SUMMARY OF THE INVENTION

The present invention provides a piezoelectric device in which a composite piezoelectric body is supported on a molded resin body having a curved shape and from which high output is obtained.

According to an aspect of the invention, a piezoelectric device includes a substrate that is flexible and thermally deformable and a composite piezoelectric body disposed on the substrate, the piezoelectric device producing output according to deformation of the composite piezoelectric body. The composite piezoelectric body includes a piezoelectric layer containing an organic binder and piezoelectric particles, a first electrode layer stacked on a first surface side of the piezoelectric layer, and a second electrode layer stacked on a second surface side of the piezoelectric layer. The substrate is insert molded and integrated with a molded resin body having a curved shape.

According to this structure, the molded resin body constitutes a base substrate of the composite piezoelectric body of the piezoelectric device of the present invention, and the thickness of the base substrate is increased. Thus, the output obtained from the piezoelectric device for the same amount of deformation is increased. Moreover, even when the curved shape has two or higher dimensions, the composite piezoelectric body that copies that shape is formed. Thus, a piezoelectric device in which the composite piezoelectric body is supported on the molded resin body having a curved shape and from which high output can be obtained can be provided.

The piezoelectric particles may be formed of a polarized ferroelectric and may have a Curie temperature of 250° C. or higher.

According to this feature, even when molten resin heated to about 250° C. flows in the mold during insert molding of the molded resin body, the temperature of the piezoelectric layer in the mold can be controlled to be equal to or lower than the Curie temperature. Thus, depolarization of the piezoelectric particles subjected to the polarization process can be suppressed.

The piezoelectric particles may have a Curie temperature of 375° C. or higher.

According to this feature, even when molten resin heated to about 250° C. flows in the mold during insert molding of the molded resin body, the temperature of the piezoelectric layer in the mold can be controlled to be equal to or lower than ⅔ of the Curie temperature. Since the depolarization temperature at which depolarization of a ferroelectric starts is generally believed to be about ⅔ of the Curie temperature, the piezoelectric particles assuredly stay polarized despite heat of the insert molding of the molded resin body, and a piezoelectric device having reliable piezoelectric performance can be obtained.

The substrate may be formed of a thermoplastic resin; the organic binder may be formed of a thermoplastic resin; the first electrode layer may contain a first binder resin which is a thermoplastic resin, and first conductive particles dispersed in the first binder resin; the second electrode layer may contain a second binder resin which is a thermoplastic resin, and a second conductive particles dispersed in the second binder resin; and the organic binder may have a melt viscosity at 250° C. of 300 Pa·s or more.

According to this feature, since the substrate, the organic binder, the first binder resin, and the second binder resin are all composed of thermoplastic resins, the substrate, the first electrode layer, the piezoelectric layer, and the second electrode layer soften during insert molding of the molded resin body, and thus the shapes of the substrate and the composite piezoelectric body can copy the shape of the mold. Moreover, since the organic binder of the piezoelectric layer located between the first electrode layer and the second electrode layer has a melt viscosity at 250° C. of 300 Pa·s or more, the stiffness of the organic binder of the piezoelectric layer is somewhat retained even when molten resin heated to about 250° C. flows in the mold during insert molding of the molded resin body. Thus, short-circuiting between the first electrode layer and the second electrode layer due to heat of insert molding can be prevented.

The substrate provided with the composite piezoelectric body may be heated and pressurized to be deformed into a curved shape prior to the insert molding; and the organic binder may have a storage elastic modulus at 140° C. of 1 MPa or more and a loss elastic modulus of 0.1 MPa or more.

According to this feature, the piezoelectric layer has stiffness enough to withstand the pressure even when heat at about 140° C. and pressure are applied to the composite piezoelectric body during pre-forming that involves thermally deforming the substrate with the composite piezoelectric body into a curved shape. Thus, short-circuiting between the first electrode layer and the second electrode can be prevented. As a result, a composite piezoelectric body having reliable piezoelectric performance is obtained, and a piezoelectric device having superior output performance can be provided.

The substrate and the molded resin body may be integrated at a second surface side opposite to a first surface side of the substrate provided with the composite piezoelectric body.

According to this feature, the thickness of the base substrate is the sum of the thickness of the molded resin body and the thickness of the substrate. Thus, expansion of the piezoelectric layer increases in accordance with the further increased thickness of the base substrate, and output from the composite piezoelectric body is increased. As a result, a piezoelectric device with higher sensitivity can be provided.

An overcoat layer formed of a thermoplastic resin may be provided on the first surface side of the substrate so as to cover the composite piezoelectric body.

According to this feature, since the overcoat layer is formed of a thermoplastic resin, the overcoat layer softens during insert molding and thus can deform to copy the shape of the molded resin body. Since the overcoat layer is provided on the outermost side of the first surface side of the substrate, the composite piezoelectric body can be protected by the overcoat layer.

A maximum height (Ry) of surface roughness of the first electrode layer and the second electrode layer may be one half of the thickness of the piezoelectric layer or less.

According to this feature, even when positions of the highest portions happen to be the same in a direction in which the first electrode layer and the second electrode face each other, short-circuiting between the first electrode layer and the second electrode within the piezoelectric layer can be prevented.

The piezoelectric particles may be formed of potassium niobate.

According to this feature, a composite piezoelectric body having superior sensing properties is obtained, and a piezoelectric device having superior output performance can be provided.

Advantageous Effects of Invention

According to the piezoelectric device of the present invention, the molded resin body constitutes a base substrate of the composite piezoelectric body, and thus the thickness of the base substrate is increased. Thus, the output obtained from the piezoelectric device for the same amount of deformation increases. Moreover, even when the curved shape has or two or higher dimensions, a composite piezoelectric body that copies that shape is formed. Thus, a piezoelectric device in which a composite piezoelectric body is supported on a molded resin body having a curved shape and from which high output is obtained can be provided.

BRIEF DESCRIPTION OF THE DRAWINGS

FIGS. 5A to 5F are schematic cross-sectional views illustrating steps of the piezoelectric device according to the first embodiment of the present invention in order of the steps;

DESCRIPTION OF THE PREFERRED EMBODIMENTS

The embodiments of the present invention will now be described with reference to the drawings.

First Embodiment

Figure 1:
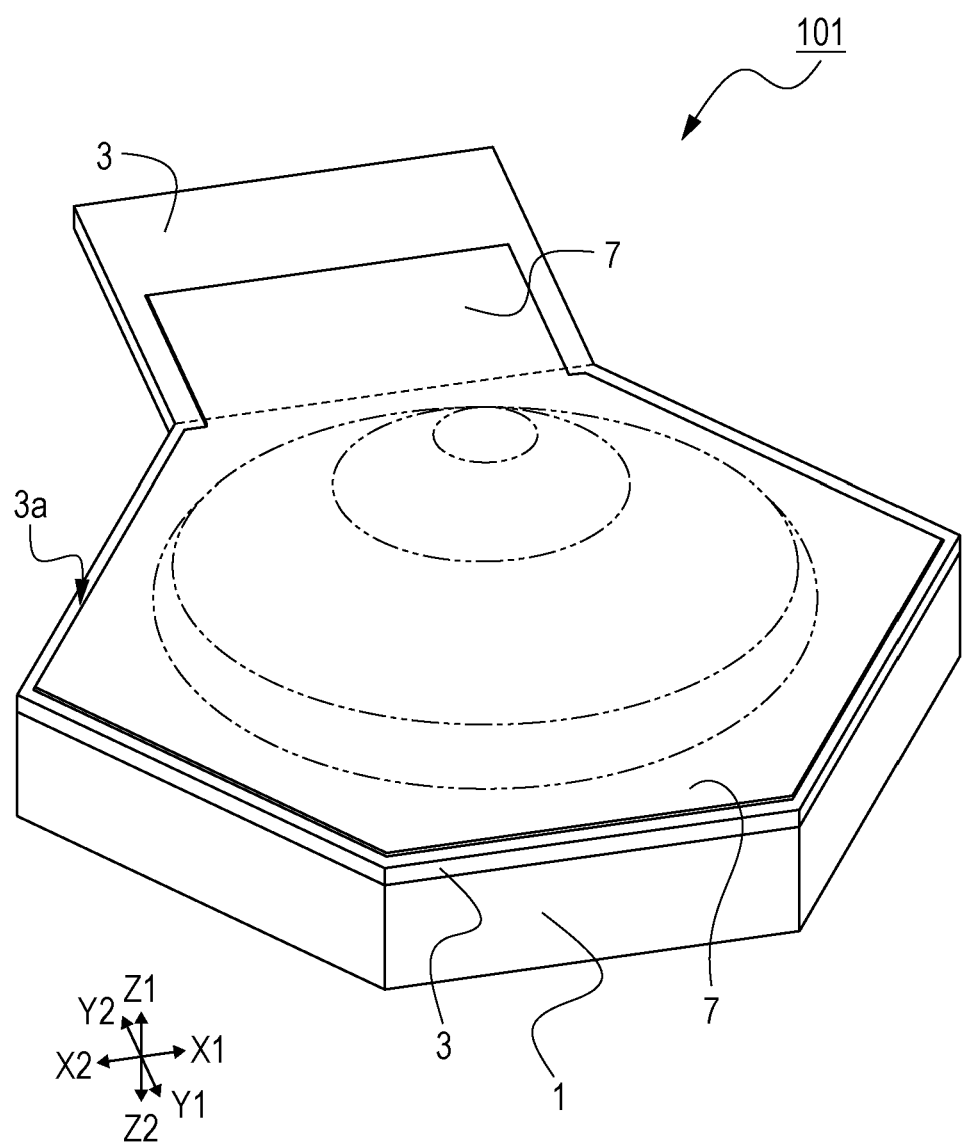
FIG. 1 is a perspective view of a piezoelectric device according to a first embodiment of the present invention.
Figure 2:
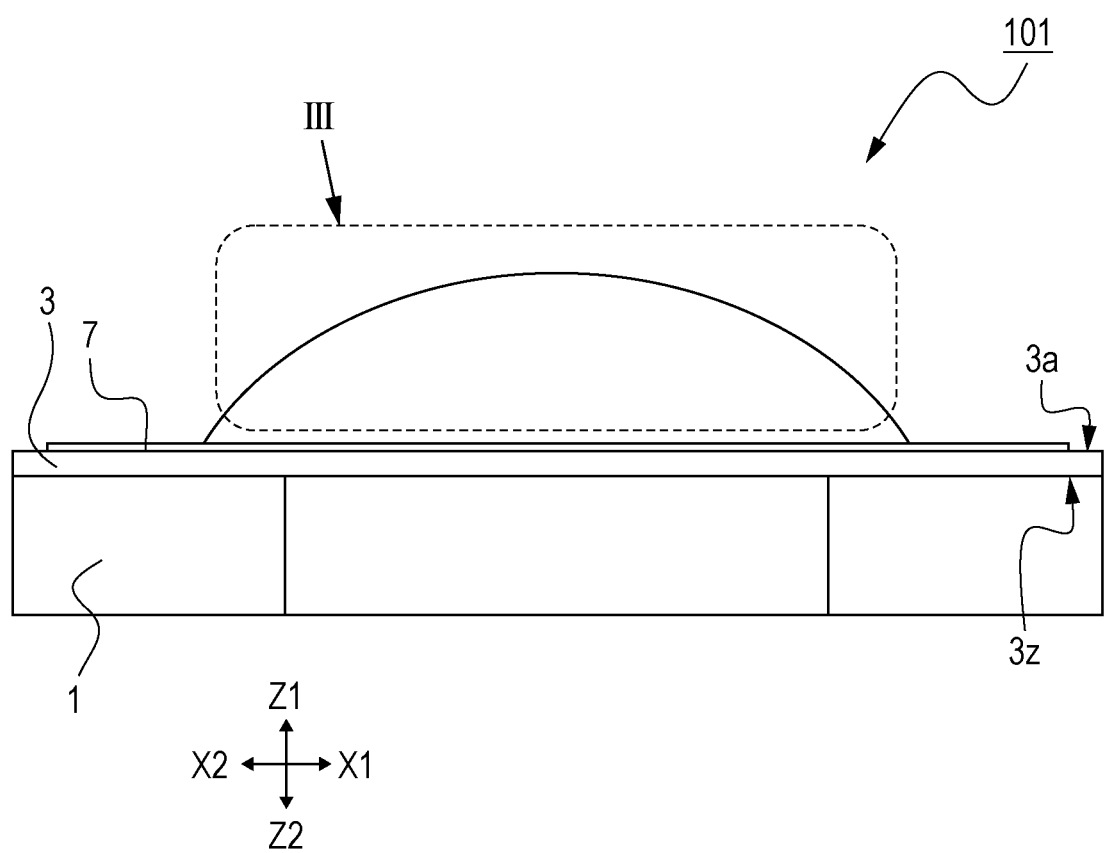
FIG. 2 is a diagram illustrating the piezoelectric device according to the first embodiment of the present invention and is a side view viewed from the Y1 side illustrated in FIG. 1.
Figure 3:
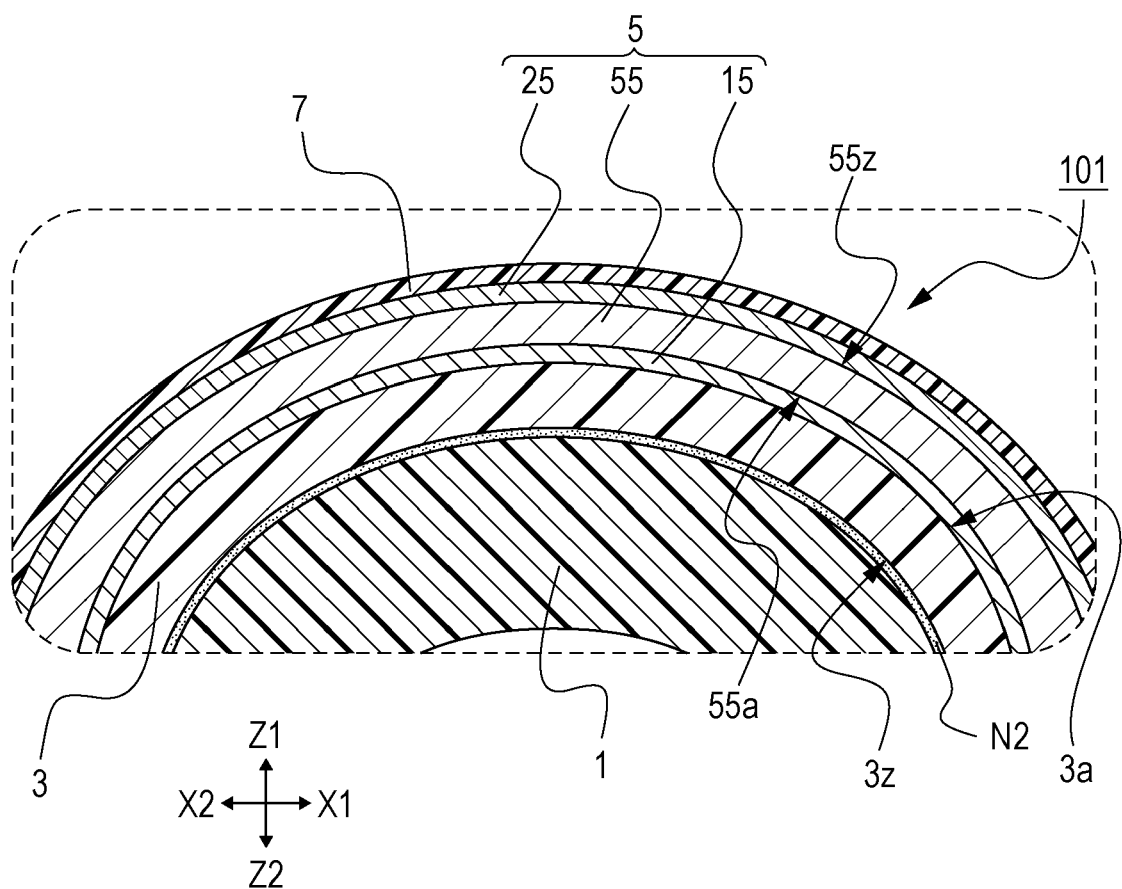
FIG. 3 is a diagram illustrating the piezoelectric device according to the first embodiment of the present invention and is a longitudinal sectional view of a III portion illustrated in FIG. 2.
Figure 4:
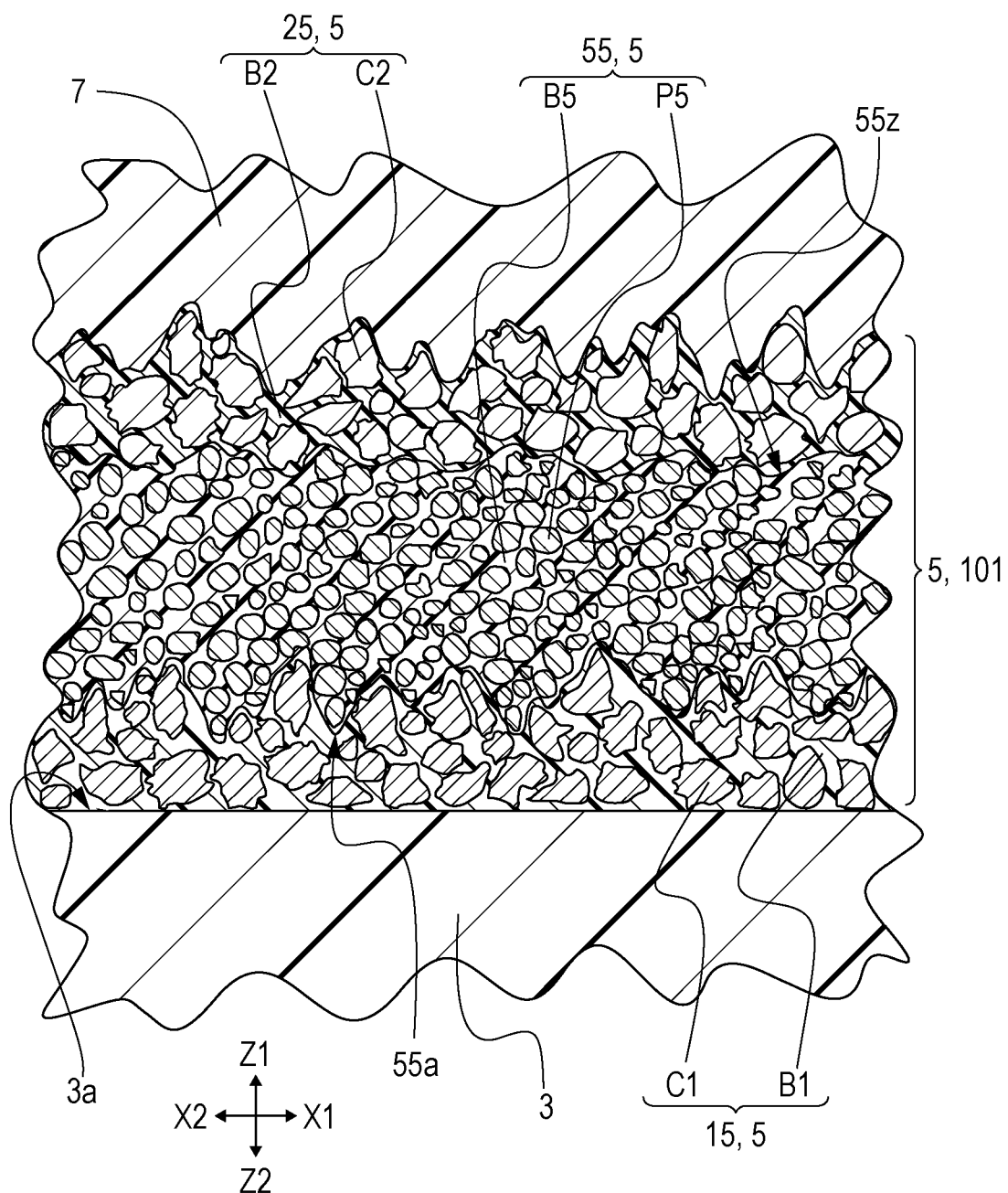
FIG. 4 is a schematic diagram of a composite piezoelectric body of the piezoelectric device according to the first embodiment of the present invention and is a cross-sectional view of a portion that constitutes a composite piezoelectric body.

FIG. 1 is a perspective view illustrating a piezoelectric device 101 according to a first embodiment of the present invention. FIG. 2 is a side view of the piezoelectric device 101 viewed from the Y1 side illustrated in FIG. 1. FIG. 3 is a longitudinal sectional view of a III portion illustrated in FIG. 2. FIG. 4 is a schematic cross-sectional view illustrating a portion of the piezoelectric device 101 that constitutes a composite piezoelectric body 5. In FIG. 4, hatchings indicating the section are omitted to simplify the illustration. FIGS. 1 to 4 are schematic views provided to simplify descriptions and do not represent actual dimensions. In particular, the size in the thickness direction (the Z direction in FIG. 3) is significantly different.

As illustrated in FIGS. 1 and 2, the piezoelectric device 101 according to the first embodiment of the present invention has a dome-like curved shape on an upper surface side, is shaped to have a hexagonal shape as a whole, and, as illustrated in FIG. 3, includes a molded resin body 1 having a curved shape, a substrate 3 integrated with the molded resin body 1, a composite piezoelectric body 5 disposed on a first surface 3a of the substrate 3, and an overcoat layer 7 that covers the composite piezoelectric body 5. In addition, in the first embodiment of the present invention, a thin adhesive N2 is used between the molded resin body 1 and the substrate 3 to ensure bonding. When a user operates the piezoelectric device 101, such as pressing the dome-like curved shape portion, that portion deforms and the composite piezoelectric body 5 in that portion also deforms, resulting in output corresponding to the deformation.

First, the molded resin body 1 of the piezoelectric device 101 is prepared by injection-molding using an injection molding machine by using, as a raw material, a synthetic resin such as an acrylic resin (polymethyl methacrylate, PMMA), a polycarbonate resin (polycarbonate, PC), or a polymer alloy resin thereof. As illustrated in FIG. 1, the formed shape is a hexagonal shape as a whole with a dome-like curved shape attached to it. This is done by insert molding by inserting the substrate 3 into a mold simultaneously.

Next, the substrate 3 of the piezoelectric device 101 is a sheet-shape film substrate composed of a thermoplastic resin such as polyethylene terephthalate (PET), has flexibility, and, as illustrated in FIG. 3, disposed on a protruding side of the curved shape of the molded resin body 1. The substrate 3 and the molded resin body 1 are integrated at a second surface 3z side of the substrate 3 (second surface 3z is the surface opposite of the first surface 3a). As described above, a thin adhesive N2 is provided between the molded resin body 1 and the substrate 3 to ensure bonding.

Since a thermoplastic resin is used in the substrate 3, the substrate 3 is thermally deformable. Thus, the substrate 3 is heated and pressurized before insert molding so as to be deformed into a shape that copies the curved shape of the upper surface of the molded resin body 1. Note that although a film substrate, e.g., polyethylene terephthalate (PET) is preferably used in the flexible substrate 3, a film substrate of any other thermoplastic synthetic resin, for example, polyethylene (PE), polyethylene naphthalate (PEN), or polyphenylene sulfide (PPS) may be used. The substrate 3 only needs to be thermally deformable, and, for example, may be a film substrate of a thermosetting resin, for example, polyimide (PI) or an aramid resin (aromatic polyamide), or a filler-containing film substrate containing the above-mentioned material and an inorganic filler charged therein. The substrate 3 is not limited to synthetic resin.

Next, the composite piezoelectric body 5 of the piezoelectric device 101 is, as illustrated in FIG. 3, disposed on the first surface 3a side of the substrate 3, and includes a first electrode layer 15 stacked on the first surface 3a of the substrate 3, a piezoelectric layer 55 stacked on the first electrode layer 15, and a second electrode 25 stacked on the piezoelectric layer 55. The composite piezoelectric body 5 has a desired pattern and is formed on the substrate 3; however, in FIGS. 1 and 2, the details of the pattern of the composite piezoelectric body 5 are not illustrated for the purposes of simplicity.

First, as illustrated in FIG. 4, the first electrode layer 15 of the composite piezoelectric body 5 includes, for example, a first binder resin B1 composed of a thermoplastic resin such as a polyester resin, and first conductive particles C1, such as conductive carbon powder, dispersed in the matrix of the first binder resin B1. The first conductive particle C1 content in the first binder resin B1 is adjusted to be 5 to 70 (vol %) and the thickness is about 5 to 20 μm.

Next, as illustrated in FIG. 4, the piezoelectric layer 55 of the composite piezoelectric body 5 includes an organic binder B5 composed of a thermoplastic resin, such as a polyester resin, and piezoelectric particles P5 dispersed in the matrix of the organic binder B5. The piezoelectric layer 55 forms a layer in which the piezoelectric particles P5 are contained in the organic binder B5, and is polarized in the layer thickness direction.

According to the first embodiment of the present invention, a synthetic resin that has properties such as a melt viscosity at 250° C. of 300 Pa·s or more, a storage elastic modulus at 140° C. of 1 MPa or more, and a loss elastic modulus of 0.1 MPa or more is used as the organic binder B5.

Furthermore, according to the first embodiment of the present invention, the piezoelectric particles P5 are preferably formed of potassium niobate ($KNbO_3$), which has a perovskite crystal structure. In this manner, a composite piezoelectric body 5 with better sensing properties is obtained, and the output performance is enhanced. The piezoelectric particles P5 are preferably a piezoelectric (ferroelectric) that has a Curie temperature of 250° C. or higher and preferably 375° C. or higher. Examples thereof include piezoelectrics having a Curie temperature of 375° C. or higher, such as potassium niobate (435° C.), lead titanate (490° C.), lead metaniobate (570° C.), quartz (573° C.), and lithium niobate (1210° C.); and piezoelectrics having a Curie temperature of 250° C. or higher, such as lead zirconate titanate (PZT, 320° C.) and sodium niobate (365° C.)

Lastly, as illustrated in FIG. 4, as with the first electrode layer 15, the second electrode 25 of the composite piezoelectric body 5 includes a second binder resin B2 composed of a thermoplastic resin such as a polyester resin, and second conductive particles C2, such as conductive carbon powder, dispersed in the matrix of the second binder resin B2. The second conductive particle C2 content in the second binder resin B2 is adjusted to 5 to 70 (vol %), and the thickness thereof is about 5 to 20 μm. Although thermoplastic resins are preferably used as the first binder resin B1 and the second binder resin B2, this is not limiting. Alternatively, a thermosetting resin, such as an epoxy resin or a phenolic resin, may be used.

As illustrated in FIGS. 3 and 4, the composite piezoelectric body 5 having the structure described above includes the first electrode layer 15 disposed on a first surface 55a side of the piezoelectric layer 55 and the second electrode 25 disposed on a second surface 55z side so that the piezoelectric layer 55 is sandwiched between the electrodes. An output corresponding to deformation of the piezoelectric layer 55 is obtained between the first electrode layer 15 and the second electrode 25. More preferably, the maximum height (Ry) of the surface roughness of the first electrode layer 15 and the second electrode 25 is set to one half of the thickness of the piezoelectric layer 55 or less. The maximum height (Ry) is a value measured by a method prescribed in JIS standards, JIS B 0601 (1994). The thickness (A thickness) of the piezoelectric layer 55 described here is a value obtained by measuring the average thickness (B thickness) of the first electrode layer 15 on the substrate 3, measuring the average thickness (C thickness) of the two layers, the first electrode layer 15 and the piezoelectric layer 55 on the first electrode layer 15, and subtracting the B thickness from the C thickness, the result of which is assumed to be the A thickness (thickness of the piezoelectric layer 55).

Due to this structure, even when positions of the highest portions happen to be the same in a direction in which the first electrode layer 15 and the second electrode 25 face each other, short-circuiting between the first electrode layer 15 and the second electrode 25 within the piezoelectric layer 55 can be prevented.

Lastly, the overcoat layer 7 of the piezoelectric device 101 is composed of a synthetic resin material containing a thermoplastic resin, such as an acrylic resin. As illustrated in FIG. 3, the overcoat layer 7 is provided on the first surface 3a side of the substrate 3 to cover the composite piezoelectric body 5. Thus, the overcoat layer 7 can deform to copy the curved shape of the molded resin body 1, and the overcoat layer 7 can protect composite piezoelectric body 5 even when the molded resin body 1 has a protruding curved shape.

In the piezoelectric device 101 having the above-described structure, the substrate 3 with the composite piezoelectric body 5 is integral with the molded resin body 1 having a curved shape; thus, the molded resin body 1 functions as a base substrate of the composite piezoelectric body 5, and the thickness of the base substrate is increased. As a result, the output from the piezoelectric device 101 increases for the same amount of deformation.

Furthermore, since the substrate 3 and the molded resin body 1 are integrated at the second surface 3z side, which is the side opposite to the first surface 3a of the substrate 3 provided with the composite piezoelectric body 5, the thickness of the base substrate is the sum of the thickness of the substrate 3 and the thickness of the molded resin body 1. Since expansion of the piezoelectric layer 55 increases in accordance with the further increased thickness of base substrate, the output from the composite piezoelectric body 5 is increased. As a result, a piezoelectric device 101 with higher sensitivity can be provided.

Figure 6A:
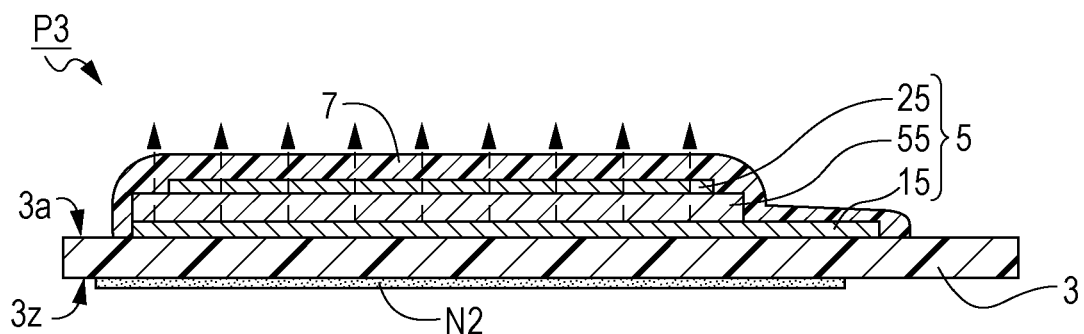
FIGS. 6A to 6C are schematic cross-sectional views of steps of the piezoelectric device according to the first embodiment of the present invention in order of steps following the step illustrated in FIG. 5F.
Figure 6B:
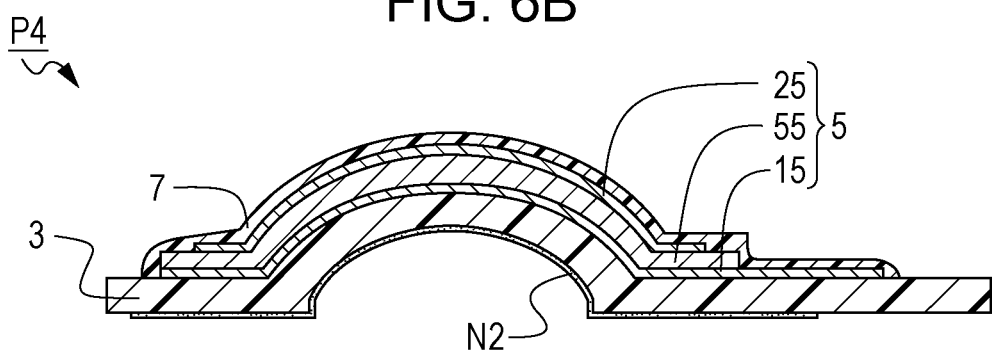
Figure 6C:
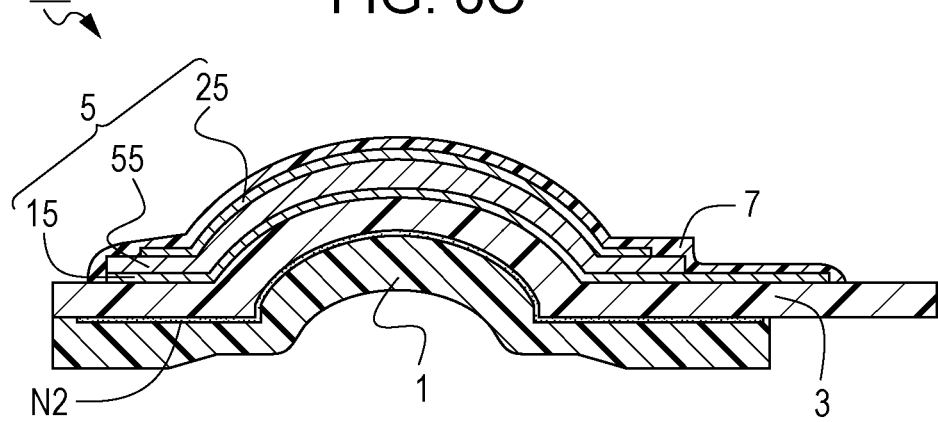

Next, a method for producing the piezoelectric device 101 according to the first embodiment of the present invention is described by using step diagrams and specific numerical examples. FIGS. 5A to 5F are schematic diagrams illustrating steps of the piezoelectric device 101 according to the first embodiment of the present invention. FIG. 5A is a cross-sectional view illustrating the state after completion of a preparation step P1, FIG. 5B is a cross-sectional view illustrating the state after completion of a first electrode step P21 of a piezoelectric body forming step P2, FIG. 5C is a cross-sectional view illustrating the state after completion of a piezoelectric body stacking step P22 of the piezoelectric body forming step P2, FIG. 5D is a cross-sectional view illustrating the state after completion of a second electrode step P23 of the piezoelectric body forming step P2, FIG. 5E is a cross-sectional view illustrating the state after completion of a coat layer forming step P24 of the piezoelectric body forming step P2, and FIG. 5F is a cross-sectional view illustrating the state after completion of an adhesive step P25 of the piezoelectric body forming step P2. FIGS. 6A to 6C are schematic diagrams illustrating steps following the step illustrated in FIG. 5F. FIG. 6A is a cross-sectional view illustrating the state after completion of a polarizing step P3, FIG. 6B is a cross-sectional view illustrating the state after completion of a forming step P4, and FIG. 6C is a cross-sectional view illustrating the state after completion of a molding step P5. FIGS. 5A to 5F and 6A to 6C are schematic views provided to simplify the description and thus the size in the thickness direction (vertical direction in FIGS. 5A to 5F and 6A to 6C) is significantly different from the actual size.

The method for producing the piezoelectric device 101 according to the first embodiment of the present invention includes a preparation step P1 of preparing a substrate 3 and a piezoelectric body forming step P2 of forming a composite piezoelectric body 5 on a first surface 3a of the substrate 3 illustrated in FIGS. 5A to 5F, and a polarizing step P3 of polarizing the composite piezoelectric body 5, a forming step P4 of thermally deforming the substrate 3, and a molding step P5 of insert molding the substrate 3 illustrated in FIGS. 6A to 6C.

First, the preparation step P1 of preparing a film substrate that serves as a substrate 3 is performed. In this preparation step P1, a film substrate that is flexible and thermally deformable is prepared and subjected to an annealing step of relaxing strain, and a hole forming step of forming holes at desired positions is performed. Then a cutting step of cutting the film substrate into desired size is performed to prepare a substrate 3 illustrated in FIG. 5A.

Next, the piezoelectric body forming step P2 of forming a composite piezoelectric body 5 on a first surface 3a of the substrate 3 is performed. The piezoelectric body forming step P2 includes a first electrode step P21 of forming a first electrode layer 15 on the first surface 3a of the substrate 3, a piezoelectric body stacking step P22 of stacking a piezoelectric layer 55 on the first electrode layer 15, a second electrode step P23 of stacking a second electrode 25 on the piezoelectric layer 55, a coat layer forming step P24 of forming an overcoat layer 7 on the first surface 3a side of the substrate 3 so as to cover the composite piezoelectric body 5, and an adhesive step P25 of providing an adhesive N2 on the second surface 3z side of the substrate 3. In all of the steps, layers are formed by a screen printing technique.

The first electrode step P21 of the piezoelectric body forming step P2 includes mixing a first binder resin B1, such as a polyester resin, a solvent, such as carbitol acetate, and carbon powder, such as carbon black or graphite, to obtain conductive carbon paste, and applying the carbon paste to the first surface 3a of the substrate 3 by printing to draw a desired pattern. The carbon paste is then heated, dried, and solidified so as to form, as illustrated in FIG. 5B, a first electrode layer 15 on the first surface 3a of the substrate 3. The thickness of the first electrode layer 15 at this stage is about 5 μm to 20 μm. The maximum height (Ry) of the surface roughness of the first electrode layer 15 is about 3 μm to 8 μm. When graphite is used as the carbon powder, in order to suppress the maximum height (Ry) to a small value, it is preferable to decrease the average particle diameter of the graphite. Specifically, graphite having an average particle size of 1 μm or less is preferably used.

The piezoelectric body stacking step P22 of the piezoelectric body forming step P2 includes mixing an organic binder B5, such as a polyester resin, a solvent, such as carbitol acetate, and piezoelectric particles P5 of potassium niobate ($KNbO_3$) to obtain piezoelectric paste, and applying the piezoelectric paste to the first electrode layer 15 by printing to draw a desired pattern. The piezoelectric paste is then heated, dried, and solidified so as to form, as illustrated in FIG. 5C, the piezoelectric layer 55 on the first electrode layer 15. The thickness of the piezoelectric layer 55 at this stage is about 10 μm to 25 The thickness of the piezoelectric layer 55 can be increased to about 100 μm by repeating the printing step of the piezoelectric layer 55.

The second electrode step P23 of the piezoelectric body forming step P2 includes mixing a second binder resin B2, such as a polyester resin, a solvent, such as carbitol acetate, and carbon powder, such as carbon black or graphite, to obtain conductive carbon paste, and applying the carbon paste to the piezoelectric layer 55 by printing to draw a desired pattern. The carbon paste is then heated, dried, and solidified so as to form, as illustrated in FIG. 5D, a second electrode 25 stacked on the piezoelectric layer 55. The thickness of the second electrode 25 at this stage is, as with the first electrode layer 15, about 5 μm to 20 μm.

The coat layer forming step P24 of the piezoelectric body forming step P2 includes applying an insulating ink to the first surface 3a side of the substrate 3 by printing so as to cover the composite piezoelectric body 5, the insulating ink containing a solvent, such as carbitol, and a synthetic resin, such as an acrylic resin, dissolved therein. The insulating ink is heated, dried, and solidified so as to form, as illustrated in FIG. 5E, an overcoat layer 7 on the first surface 3a side of the substrate 3. The thickness of the overcoat layer 7 at this stage is about 5 μm to 15 μm.

The adhesive step P25 of the piezoelectric body forming step P2 includes applying an adhesive N2 to the second surface 3z side of the substrate 3 by printing, the adhesive N2 having excellent adhesion to a polyethylene terephthalate resin (PET) or a polycarbonate resin (PC). The adhesive N2 is then dried so as to form the adhesive N2 on the second surface 3z side of the substrate 3, as illustrated in FIG. 5F.

Next, a polarizing step P3 of polarizing the piezoelectric layer 55 of the composite piezoelectric body 5 is preformed. The polarizing step P3 includes heating the piezoelectric layer 55 to a temperature near 130° C. and applying, between the first electrode layer 15 and the second electrode 25, a DC voltage of about 1 to 10 (V/μm) corresponding to the thickness of the piezoelectric layer 55. After the temperature is returned to room temperature, a terminal portion not illustrated in the drawing is used to short-circuit between the first electrode layer 15 and the second electrode 25 to erase excess capacitance, and the process is ended. The DC voltage applied is preferably 4 to 6 (V/μm). As such, the piezoelectric layer 55 can be easily processed to have a polarized state illustrated in FIG. 6A. Note that the one-dot chain lines in FIG. 6A indicate the direction of polarization.

Next, a forming step P4 of thermally deforming the substrate 3 to form a curved shape is performed. In the forming step P4, first, the substrate 3 provided with the composite piezoelectric body 5 is inserted into a mold and the mold is clamped. Next, heating at about 140° C. and pressurizing at about 6 kN are performed on the mold. The substrate 3 is then thermally deformed to copy the curved shape of the mold. As a result, as illustrated in FIG. 6B, a substrate 3 having a curved shape is formed. At this stage, in the first embodiment of the present invention, because the organic binder B5, which has a storage elastic modulus at 140° C. of 1 MPa or more and a loss elastic modulus of 0.1 MPa or more, is used in the piezoelectric layer 55, the piezoelectric layer 55 has enough stiffness to withstand pressure even when a heat of about 140° C. and a pressure are applied to the composite piezoelectric body 5. Thus, short-circuiting between the first electrode layer 15 and the second electrode 25 can be prevented. The curved shape of the mold is prepared to have a shape that copies the curved shape of the molded resin body 1.

Lastly, a molding step P5 of molding the molded resin body 1 is performed. In the molding step P5, a thermoplastic resin, such as a polycarbonate resin (PC), is used, and insert molding is performed by placing the substrate 3 having a curved shape to a mold heated to about 80° C. Then, as illustrated in FIG. 6C, the substrate 3 thermally deforms to copy the curved shape of the molded resin body 1 formed in the mold, and the molded resin body 1 having the curved shape and the substrate 3 are integrally formed. At this stage, the molten resin heated to about 250° C. flows inside the mold, and heat and pressure are applied to the substrate 3 provided with the composite piezoelectric body 5. In such a case also, because the Curie temperature of the piezoelectric particles P5 is 250° C. or higher, the temperature of the piezoelectric layer 55 in the mold can be controlled to be equal to or lower than the Curie temperature. Thus, depolarization of the piezoelectric particles P5 subjected to the polarization process can be suppressed. When the Curie temperature of the piezoelectric particles P5 is 375° C. or higher, the temperature of the piezoelectric layer 55 in the mold can be controlled to be ⅔ of the Curie temperature or lower. Since the depolarization temperature at which depolarization of a ferroelectric starts is generally believed to be about ⅔ of the Curie temperature, the piezoelectric particles P5 assuredly stay polarized despite heat of the insert molding of the molded resin body 1, and a piezoelectric device 101 having reliable piezoelectric performance can be obtained.

Since the substrate 3, the organic binder B5, the first binder resin B1, the second binder resin B2, and the overcoat layer 7 are all composed of thermoplastic resins, the substrate 3, the first electrode layer 15, the piezoelectric layer 55, the second electrode 25, and the overcoat layer 7 soften during insert molding of the molded resin body 1, and thus the shape of the substrate 3 and the shape of the composite piezoelectric body 5 can copy the shape of the mold. As a result, even when the curved shape is a shape having two or higher dimensions, the composite piezoelectric body 5 can copy that shape.

Since the organic binder B5 of the piezoelectric layer 55 located between the first electrode layer 15 and the second electrode 25 has a melt viscosity at 250° C. of 300 Pa·s or more, the stiffness of the organic binder B5 of the piezoelectric layer 55 is somewhat retained even when molten resin heated to about 250° C. flows in the mold during insert molding of the molded resin body 1. Thus, short-circuiting between the first electrode layer 15 and the second electrode 25 due to heat of insert molding can be prevented.

Since the overcoat layer 7 is located on the outermost side of the first surface 3a side of the substrate 3, the composite piezoelectric body 5 can be protected by the overcoat layer 7 during insert molding.

Figure 7:
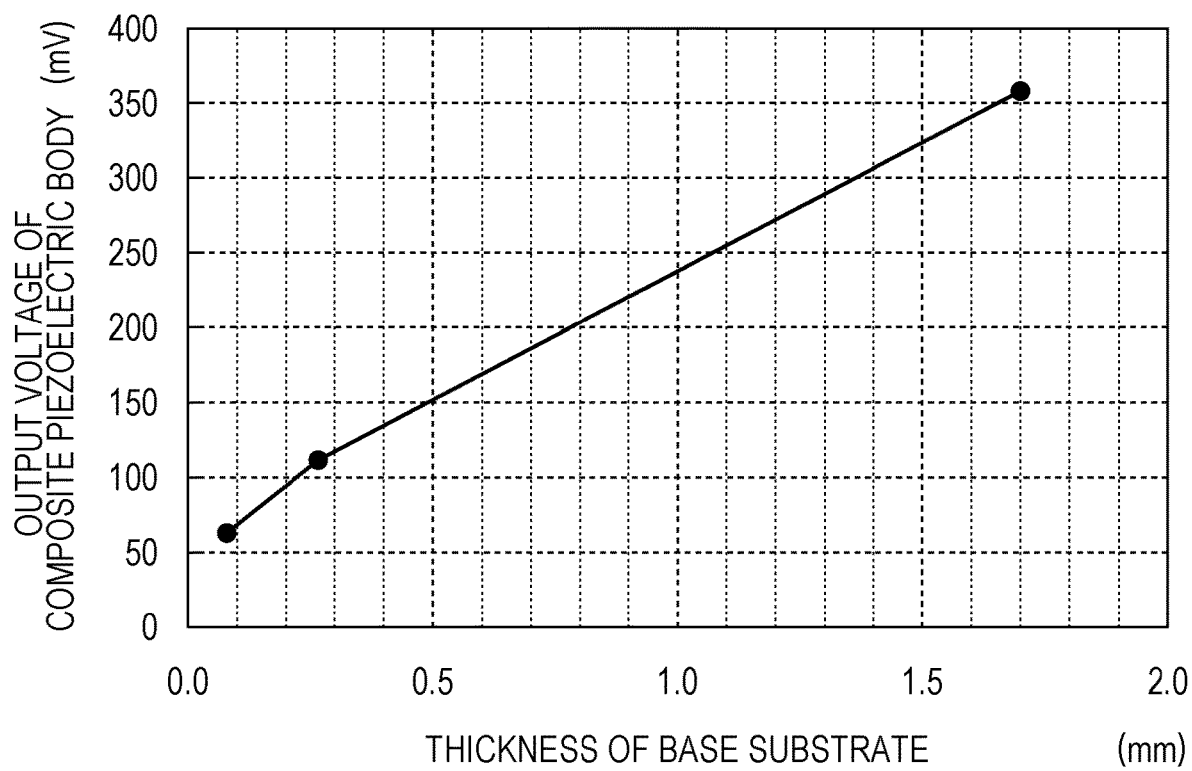
FIG. 7 is a graph showing simulation results from the piezoelectric device according to the first embodiment of the present invention.
Figure 8:
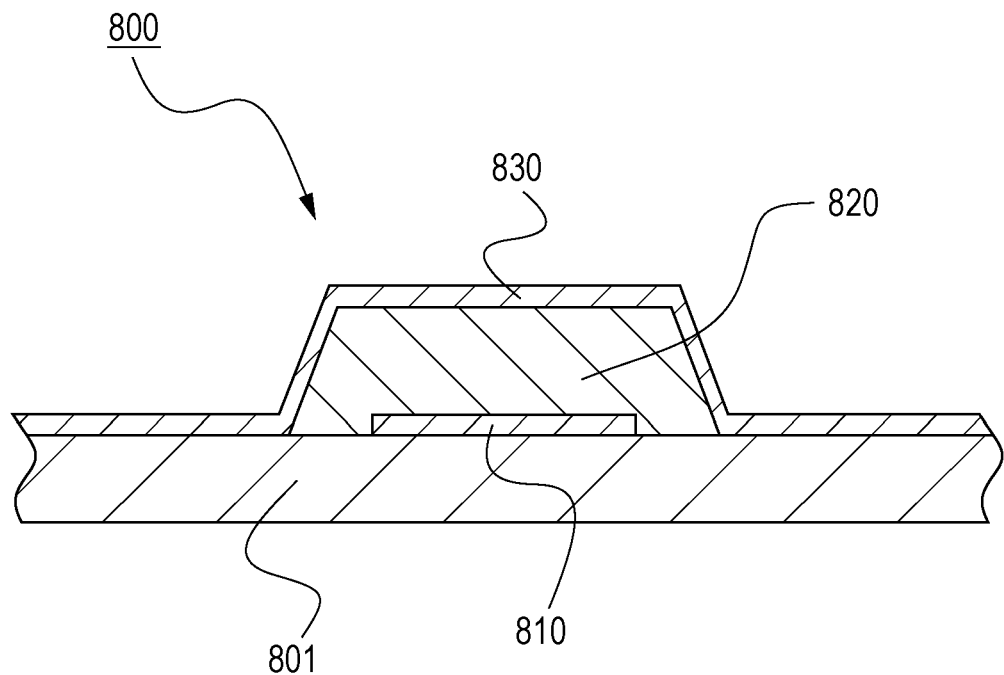
FIG. 8 is a schematic cross-sectional view of a piezoelectric element of related art example 1.
Figure 9:
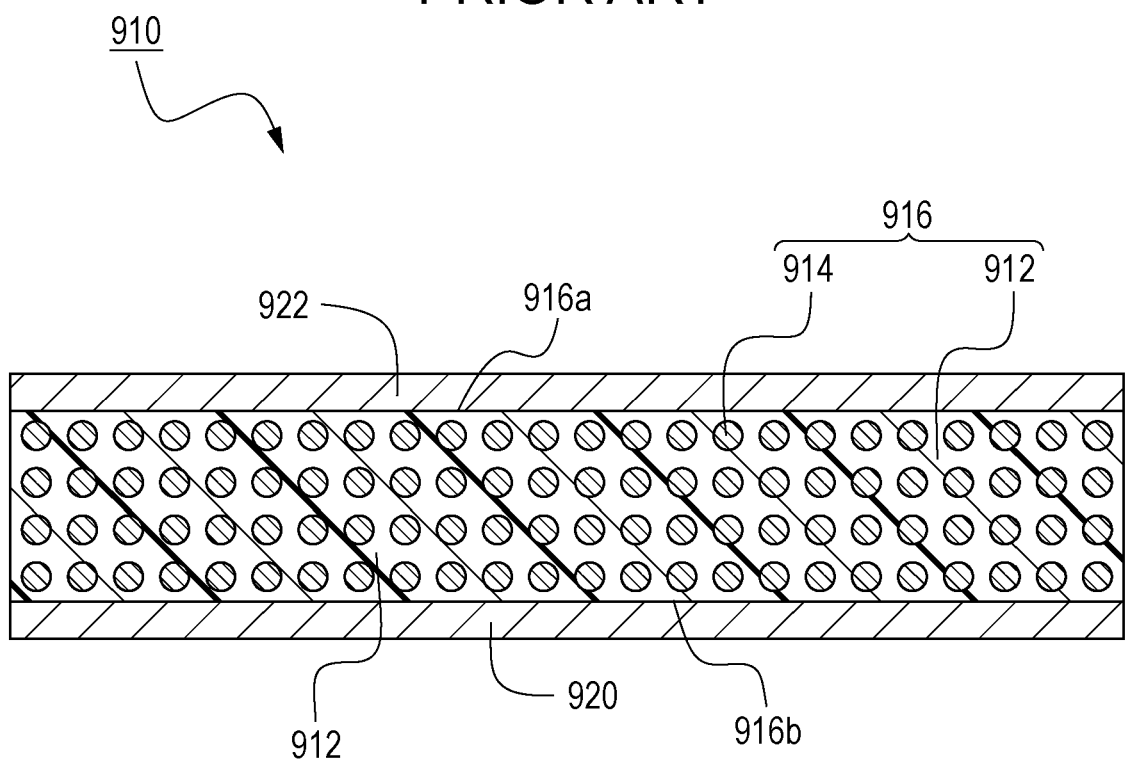
FIG. 9 is a schematic cross-sectional view of a polymer composite piezoelectric body of related art example 2.

The advantageous effects of the piezoelectric device 101 according to the first embodiment of the present invention configured as described above will now be summarized and described with reference to test results. FIG. 7 is a graph showing simulation results from the piezoelectric device 101 according to the first embodiment of the present invention. The horizontal axis indicates the thickness of the base substrate and the vertical axis indicates the output voltage value. The thickness of the base substrate referred in here is the total of the thickness of the substrate 3 and the thickness of the molded resin body 1.

In the piezoelectric device 101 according to the first embodiment of the present invention, the substrate 3 with the composite piezoelectric body 5 is insert molded and integrated with the molded resin body 1 having the curved shape; thus, the molded resin body 1 functions as the base substrate for the composite piezoelectric body 5, thereby increasing the thickness of the base substrate. As illustrated in FIG. 7, the output obtained from the piezoelectric device 101 increases according to the thickness of the base substrate for the same amount of deformation. Moreover, even when the curved shape has two or higher dimensions, a composite piezoelectric body 5 that copies that shape is formed. Thus, a piezoelectric device 101 in which the composite piezoelectric body 5 is supported on the molded resin body 1 having the curved shape and from which high output is obtained can be provided.

Since the Curie temperature of the piezoelectric particles P5 is 250° C. or higher, the temperature of the piezoelectric layer 55 in the mold remains to be equal to or lower than the Curie temperature even when the molten resin heated to about 250° C. flows in the mold during insert molding of the molded resin body 1. Thus, depolarization of the piezoelectric particles P5 subjected to the polarization process can be suppressed.

Since the Curie temperature of the piezoelectric particles P5 is 375° C. or higher, the temperature of the piezoelectric layer 55 in the mold remains to be equal to or lower than about ⅔ of the Curie temperature even when the molten resin heated to about 250° C. flows in the mold during insert molding of the molded resin body 1. Since the depolarization temperature at which depolarization of a ferroelectric starts is generally believed to be about ⅔ of the Curie temperature, the piezoelectric particles P5 reliably stay polarized despite heat of the insert molding of the molded resin body 1, and a piezoelectric device 101 having reliable piezoelectric performance can be obtained.

Since the substrate 3, the organic binder B5, the first binder resin B1, and the second binder resin B2 are all composed of thermoplastic resins, the substrate 3, the first electrode layer 15, the piezoelectric layer 55, and the second electrode 25 soften during insert molding of the molded resin body 1, and thus the shape of the substrate 3 and the shape of the composite piezoelectric body 5 can copy the shape of the mold. As a result, even when the curved shape has two or higher dimensions, the composite piezoelectric body 5 can be formed according to the shape.

Since the organic binder B5 of the piezoelectric layer 55 located between the first electrode layer 15 and the second electrode 25 has a melt viscosity at 250° C. of 300 Pa·s or more, the stiffness of the organic binder B5 of the piezoelectric layer 55 is somewhat retained even when molten resin heated to about 250° C. flows in the mold during insert molding of the molded resin body 1. Thus, short-circuiting between the first electrode layer 15 and the second electrode 25 due to heat of insert molding can be prevented.

Since the organic binder B5 has a storage elastic modulus at 140° C. of 1 MPa or more and a loss elastic modulus of 0.1 MPa or more, the piezoelectric layer 55 has stiffness enough to withstand the pressure even when heat at about 140° C. and pressure are applied to the composite piezoelectric body 5 during pre-forming that involves thermally deforming the substrate 3 with the composite piezoelectric body 5 into a curved shape. Thus, short-circuiting between the first electrode layer 15 and the second electrode 25 can be prevented. As a result, a composite piezoelectric body 5 having reliable piezoelectric performance is obtained, and a piezoelectric device 101 having superior output performance can be provided.

Since the substrate 3 and the molded resin body 1 are integrated at the second surface 3z side opposite to the first surface 3a side of the substrate 3 provided with the composite piezoelectric body 5, the thickness of the base substrate is the sum of the thickness of the molded resin body 1 and the thickness of the substrate 3. Since expansion of the piezoelectric layer 55 increases according to the increased thickness of the base substrate, the output from the composite piezoelectric body 5 is increased further. Thus, a piezoelectric device 101 having higher sensitivity can be provided.

Since the overcoat layer 7 is composed of a thermoplastic resin, the overcoat layer 7 softens during insert molding and thus can deform to copy the shape of the molded resin body 1. Since the overcoat layer 7 is located on the outermost side of the first surface 3a side of the substrate 3, the composite piezoelectric body 5 can be protected by the overcoat layer 7.

Since the maximum height (Ry) of the surface roughness of the electrode layers (first electrode layer 15 and second electrode 25) is one half of the thickness of the piezoelectric layer 55 or less, even when positions of the highest portions happen to be the same in a direction in which the first electrode layer 15 and the second electrode 25 face each other, short-circuiting between the first electrode layer 15 and the second electrode 25 within the piezoelectric layer 55 can be prevented.

Since the piezoelectric particles P5 are composed of potassium niobate, a composite piezoelectric body 5 having higher sensing properties is obtained, and a piezoelectric device 101 having superior output performance can be provided.

The present invention is not limited to the embodiments described above can be can be modified as follows, for example. These embodiments are also within the technical scope of the present invention.

Modification Example 1

Although the molded resin body 1 had a dome-like curved shape on the upper surface side thereof in the first embodiment, the molded resin body 1 is not limited to this. For example, the molded resin body 1 may have a recessed curved shape or an elongated curved shape, or a curved shape at corners, or may have a curved shape as a whole.

Modification Example 2

Although a thermoplastic resin is used as the material for the molded resin body 1 and injection molding is conducted to form the molded resin body 1 in the first embodiment, a thermosetting resin may be used alternatively. In such a case, transfer molding is performed to obtain a molded resin body. According to transfer molding, the temperature of the molten resin in the mold is about 170° C. to 180° C., which is lower than the Curie temperature of 250° C. or higher. Compared to the case of insert molding, the possibility of depolarization of the piezoelectric particles P5 subjected to the polarization process is further reduced.

Modification Example 3

In the first embodiment, the forming step P4 of preliminarily heating and pressurizing the substrate 3 provided with the composite piezoelectric body 5 is performed before insert molding. However, this forming step P4 may be omitted. In such a case, the substrate 3 is formed into a curved shape by the heat and pressure applied during molding the molded resin body 1.

Modification Example 4

In the first embodiment, the substrate 3 and the molded resin body 1 are integrated at the second surface 3z side of the substrate 3 provided with the composite piezoelectric body 5. Alternatively, the substrate 3 and the molded resin body 1 may be integrated at the first surface 3a side of the substrate 3 provided with the composite piezoelectric body 5.

Modification Example 5

In the first embodiment, the thin adhesive N2 is used to ensure bonding between the molded resin body 1 and the substrate 3. Alternatively, the molded resin body 1 and the substrate 3 may be integrated by direct bonding without using the adhesive N2.

Modification Example 6

In the first embodiment, the composite piezoelectric body 5 includes one set of the first electrode layer 15 and the second electrode 25 sandwiching the piezoelectric layer 55 but this structure is not limiting. For example, an additional piezoelectric layer and an additional electrode layer may be disposed on the second electrode 25 so that the second electrode 25 functions as the first electrode layer and the additional electrode layer functions as the second electrode layer, thereby forming two piezoelectric layers (piezoelectric layer 55 and additional piezoelectric layer). As a result, the output obtained from the composite piezoelectric body can be increased. The structure that includes two piezoelectric layers stacked as such is not limiting, and three more piezoelectric layers may be formed.

The present invention is by no means limited by the embodiments described above and is subject to modifications and alterations without departing from the scope of the present invention.

What is claimed is:

1. A piezoelectric device producing output according to deformation of a composite piezoelectric body, the piezoelectric device comprising:
    a substrate that is flexible and thermally deformable; and
    a composite piezoelectric body disposed on the substrate, the composite piezoelectric body including:
        a piezoelectric layer containing an organic binder and piezoelectric particles,
        a first electrode layer stacked on a first surface side of the piezoelectric layer, and
        a second electrode layer stacked on a second surface side of the piezoelectric layer,
    wherein the substrate is insert molded and integrated with a molded resin body having a curved shape;
    the substrate is formed of a thermoplastic resin;
    the organic binder is formed of a thermoplastic resin;
    the first electrode layer contains a first binder resin which is a thermoplastic resin, and first conductive particles dispersed in the first binder resin;
    the second electrode layer contains a second binder resin which is a thermoplastic resin, and a second conductive particles dispersed in the second binder resin; and
    the organic binder has a melt viscosity at 250° C. of 300 Pa·s or more.

2. The piezoelectric device according to claim 1, wherein the piezoelectric particles are formed of a polarized ferroelectric and have a Curie temperature of 250° C. or higher.

3. The piezoelectric device according to claim 2, wherein the piezoelectric particles have a Curie temperature of 375° C. or higher.

4. The piezoelectric device according to claim 1, wherein:
    the substrate provided with the composite piezoelectric body is heated and pressurized to be deformed into a curved shape prior to the insert molding; and
    the organic binder has a storage elastic modulus at 140° C. of 1 MPa or more and a loss elastic modulus of 0.1 MPa or more.

5. The piezoelectric device according to claim 1, wherein a maximum height (Ry) of surface roughness of the first electrode layer and the second electrode layer is one half of the thickness of the piezoelectric layer or less.

6. The piezoelectric device according to claim 1, wherein the piezoelectric particles are formed of potassium niobate.

7. A piezoelectric device producing output according to deformation of a composite piezoelectric body, the piezoelectric device comprising:
    a substrate that is flexible and thermally deformable; and
    a composite piezoelectric body disposed on the substrate, the composite piezoelectric body including:
        a piezoelectric layer containing an organic binder and piezoelectric particles,
        a first electrode layer stacked on a first surface side of the piezoelectric layer, and
        a second electrode layer stacked on a second surface side of the piezoelectric layer,
    wherein the substrate is insert molded and integrated with a molded resin body having a curved shape;
    the substrate and the molded resin body are integrated at a second surface side opposite to a first surface side of the substrate provided with the composite piezoelectric body; and
    an overcoat layer formed of a thermoplastic resin is provided on the first surface side of the substrate so as to cover the composite piezoelectric body.

* * * * *